US009684025B2

(12) United States Patent
Duncan et al.

(10) Patent No.: US 9,684,025 B2
(45) Date of Patent: Jun. 20, 2017

(54) DUT CONTINUITY TEST WITH ONLY DIGITAL IO STRUCTURES APPARATUS AND METHODS ASSOCIATED THEREOF

(71) Applicant: The United States of America as represented by the Secretary of the Navy, Washington, DC (US)

(72) Inventors: Adam Duncan, Bloomington, IN (US); Matthew Gadlage, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 373 days.

(21) Appl. No.: 14/554,954

(22) Filed: Nov. 26, 2014

(65) Prior Publication Data

US 2015/0145524 A1    May 28, 2015

Related U.S. Application Data

(60) Provisional application No. 61/909,093, filed on Nov. 26, 2013.

(51) Int. Cl.
*G01R 31/11* (2006.01)
*G01R 31/02* (2006.01)

(52) U.S. Cl.
CPC ............ *G01R 31/024* (2013.01); *G01R 31/11* (2013.01)

(58) Field of Classification Search
CPC ............ H05B 37/0272; H05B 37/0227; H05B 33/0854; H05B 33/0803; H05B 33/0845; H05B 37/0281; H05B 37/0218; H05B 37/03; G01R 31/11; G01R 31/008; G01R 31/021; G01R 31/024; H02J 9/065; H02J 9/02

See application file for complete search history.

(56) References Cited

U.S. PATENT DOCUMENTS

| 4,970,466 | A  | * | 11/1990 | Bolles ..................... G01R 31/11 324/533 |
| 2005/0052190 | A1 | * | 3/2005 | McCosh .............. G01B 11/024 324/644 |
| 2008/0052028 | A1 | * | 2/2008 | Pickerd ............. G01R 31/3191 702/109 |
| 2014/0183946 | A1 | * | 7/2014 | Recker ................... H02J 9/065 307/23 |

* cited by examiner

*Primary Examiner* — Alesa Allgood
(74) *Attorney, Agent, or Firm* — Christopher A. Monsey (57) ABSTRACT

A method and system for determining short, open, and good connections using digital input and output (IO) structures in a device under test (DUT) continuity test, through the combined methods of using resistance-capacitance (RC) delay, time domain reflectometry (TDR), and forcing voltage on to a single IO pin of the DUT while measuring voltage on remaining IO pins of said DUT. In one embodiment, the combined methods are executed without the DUT in a test socket to produce a first set of test values and also with the DUT in a test socket to produce a second set of test values. The first and second sets of test values are compared to determine if one or more circuits of the DUT have a short circuit, an open circuit, or are a good (have an electrical connection that is not a short circuit or an open circuit) circuit.

5 Claims, 14 Drawing Sheets

217 — Repeat steps 205 to 215 until all Tester 3 IO pins (e.g., first plurality of IO pins) connected to DUT 4 IO pins (e.g., third plurality of IO pins) have been characterized and store additional first plurality of sample values in a non-transitory computer storage readable medium 7

219 — Repeat steps 205 to 217 a predetermined number of times to determine a range of the first plurality of samples for each Tester 3 IO pin (e.g., first plurality of IO pins) and DUT 4 IO pin (e.g., third plurality of IP pins) pair which will represent an open circuit between the tester IO and the DUT IO pin pair 221 — Insert DUT 4 into DUT Interface Board (test setup) 8 and steps 205 to 217 are repeated to create a second plurality of samples 223 — Compare the first and second plurality of sample values for each tester IO and DUT IO pin pair to determine if the presence of DUT 4 has changed a recorded pattern for each pair, wherein if presence of DUT 4 has changed one or more of the recorded pattern of a respective said pair and there are more '1' values recorded, then an open circuit in DUT continuity is detected and DUT 4 should be reseated and this method should be repeated;

if presence of DUT 4 has changed a recorded pattern for one or more of each pair and there are less '1' values recorded, then either a short or good connection is likely on such a pair, and the method in FIG. 7 should be applied next;

if presence of DUT 4 has not changed a recorded pattern for one or more of each pair and the recorded pattern includes '1' values, an open circuit in DUT continuity is likely and the DUT 4 should be reseated and this method should be repeated;

if presence of DUT 4 has not changed a recorded pattern for one or more of each pair and the recorded pattern does not include '1' values, either a short or good connection is likely and the method in FIG. 7 should be applied.

301 — Providing a Test System 10 (e.g., as in fig. 1) comprising a control section and a first plurality of IO pins and a DUT Interface Board (test setup) 8 comprising a DUT Interface or connector comprising a second plurality of IO pins then inserting a DUT 4 comprising a third plurality of IO pins into the DUT interface or connector wherein the Tester 8 programmably couples the first and second plurality of IO pins 303 — Once DUT 4 is inserted into the DUT interface or connector on the DUT Interface Board (test setup) 8, all Tester 3 IO pins (e.g., first plurality of IO pins) are configured as tester output driving low (e.g., a "0" value below a predetermined voltage threshold) to discharge all the Tester 3 IO pins 305 — Place all Tester 3 IO pins (n) (e.g., first plurality of IO pins) on Tester 3 in a high-impedance state 307 — Configure a first Tester 3 IO pin of said first plurality of IO pins that is connected to a first DUT interface or connector IO pin of said second plurality of IO pins as tester output driving logic high (e.g., a "1" value above the predetermined voltage threshold)

309 — Configure a next adjacent said Tester 3 IO pin of said first plurality of IO pins as a tester input sampling at a predetermined sample rate (e.g., a highest reliable sample rate) and record one of a first plurality of sample values of pin driven high and pin sampled in a non-transitory computer storage readable medium 7

311 — Repeat step 309 for each adjacent said Tester 3 IO pin of said first plurality of IO pins and generate additional first plurality of sample values respective to each Tester 3 IO pin of said first plurality of IO pins

DUT CONTINUITY TEST WITH ONLY DIGITAL IO STRUCTURES APPARATUS AND METHODS ASSOCIATED THEREOF

CROSS-REFERENCE TO RELATED APPLICATIONS

The present application claims priority to U.S. Provisional Patent Application Ser. No. 61/909,093, filed Nov. 26, 2013, entitled "DUT CONTINUITY TEST WITH ONLY DIGITAL IO STRUCTURES AND METHODS THEREOF," the disclosure of which is expressly incorporated by reference herein.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 103,032) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

A need exists for a continuity testing system that uses digital input and output structures ("IO") without the need for an adjustable current source and analog voltage measurement. Typical testing systems rely on analog voltage measurements and adjustable current sources. Such systems are limited and do not meet the needs of having a digital system in two ways. First, the current sourcing equipment and analog voltage measurement equipment needs to be built in to the test system in order to complete the measurement. Second, non-standard IO structures that do not include an electrostatic discharge ("ESD") diode are not compatible.

According to an illustrative embodiment, the present invention relates to a computer implemented method and system for determining electrical connections for open and short circuits using digital IO structures without the application of current source and obtaining a precise voltage measurement in the device under test ("DUT"), wherein one short circuit check comprises forcing voltage on a single pin while measuring voltage on remaining pins and open circuit check comprises of either (a) measuring resistance-capacitance ("RC") delay on DUT IO; or (b) using time domain reflectometry ("TDR") or a combination of both.

Another embodiment of the present disclosure provides a non-transitory computer readable medium storing code for controlling a testing system to perform one of several predetermined tests to determine DUT continuity. The code includes instructions for measuring RC delay on DUT IO in order to determine open circuits, measuring time domain reflections for the DUT and testing system and comparing the differences to determine open circuits, and measuring voltage on remaining pins while forcing voltage onto a single pin in order to determine short circuits.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

An exemplary embodiment of the invention can relate to a computer implemented system and method for testing continuity of a DUT with only digital IO structures. A system and method could be built into a testing system in order to determine an incorrect electrical connection with a DUT in a test system, which is an increasing possibility as the microelectronics industry creates smaller geometry DUT package sizes and increasing pin counts.

Figure 1:
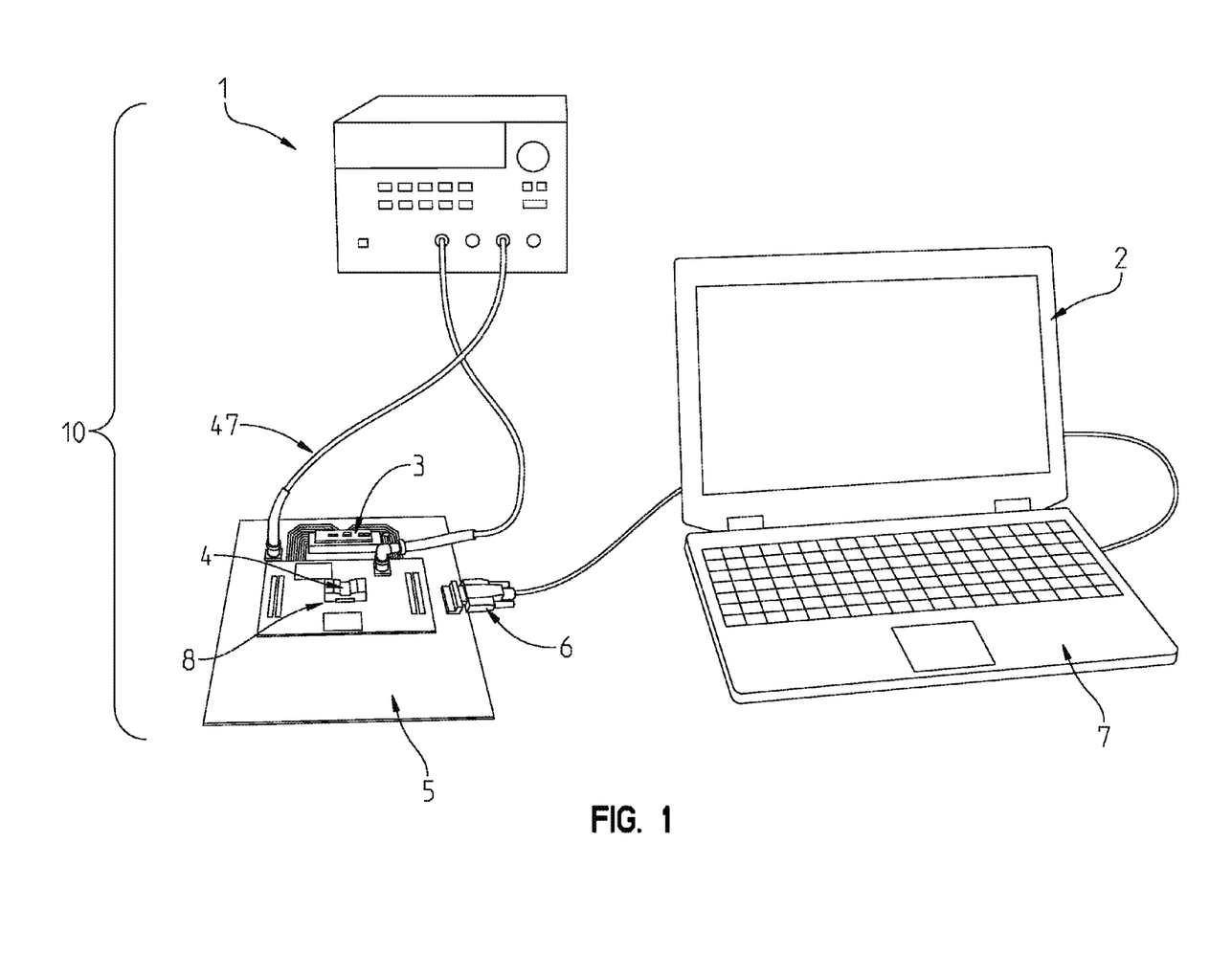
FIG. 1 shows an exemplary testing system setup in accordance with one embodiment of the invention.

Referring initially to FIG. 1, a system configured to test and report on continuity of a DUT 4 is shown. An exemplary embodiment of a test system 10 includes a Tester 3, a DUT 4, and a DUT Interface Board (test setup) 8 that selectively receives and couples with both the DUT 4 and the Tester 3 with different connectors such as plug-in or socket interface bus sections. The DUT Interface Board is coupled to plug-in interface buses on a DUT Adapter Board 5. The Tester 3 interfaces with the DUT Board Cables 47 supply power to test system 10 from power supply 1 and is connected to DUT Adapter Board 5. In this exemplar Tester 3, Tester 3 components include a field programmable gate array (FPGA), IO section comprising a number of pins or interfaces (e.g., dual-inline package or DIP, pin-header connections, etc), a crystal oscillator, programmable read only memory (PROM) that stores a default set of settings and programs that the FPGA receives and runs from a startup state, an interface section operable to receive and convey instructions and settings that are loaded onto the FPGA for test or other operations of the Tester 3, voltage regulators, voltage level shifting integrated circuits (ICs), resistors, capacitors, diodes, inductors, etc. required to provide stimulus to the DUT and sample DUT response then compare those responses with known good response and determine errors then generate test data outputs to a user or system operable to receive outputs such as a testing interface computer. An RS-232 PC connection 6 is coupled to DUT Adapter Board 5 and transmits output information from DUT Adapter Board 5 to a testing interface computer 2. RS-232 PC connection 6 is also coupled to a non-transitory computer storage readable medium 7 such that information from DUT board can be stored in non-transitory computer storage readable medium 7.

Figure 2:
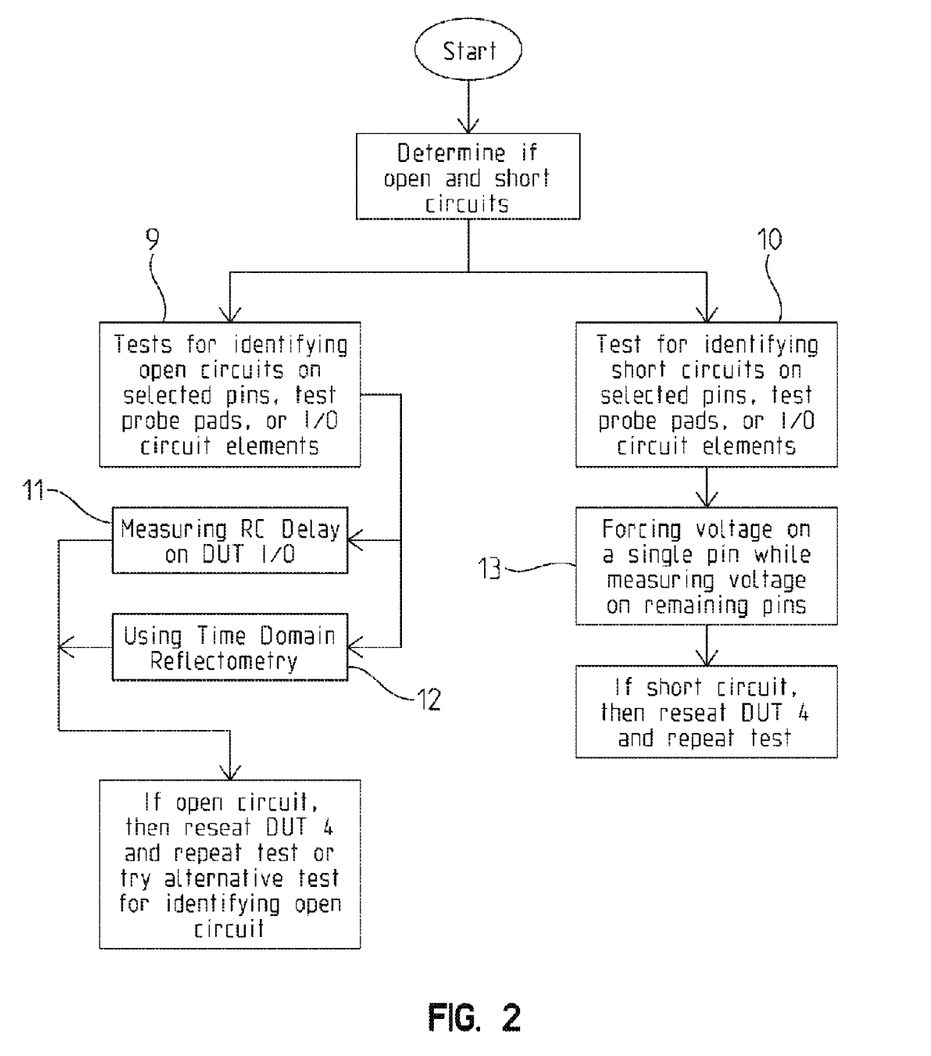
FIG. 2 shows testing options of an exemplary method of testing DUT continuity in accordance with an embodiment of the invention.

Referring to FIG. 2, testing options of an exemplary method of testing DUT continuity in accordance with an embodiment of the invention are shown. To test for identifying open circuits 9, there are various exemplary methods provided. One method 11 is measuring the RC delay on a DUT IO with and without a DUT installed in the DUT. A second method 12 uses TDR to determine if an open circuit is present. If an open circuit is detected, then DUT 4 needs to be reseated and various methods (one or several) described herein (see below) should be repeated for an open circuit.

Two tests for identifying short circuits in various apparatus and methods are provided herein. One method involves forcing voltage on a single pin while measuring voltage on remaining pins. If a short circuit is detected from forcing voltage method 13 (FIG. 3a-b), then DUT 4 needs to be reseated and method 13 needs to be conducted again. Methods 11 (RC Delay), 12 (TDR), and 13 (forcing voltage on a pin) are described in greater detail below with respect to FIGS. 3a-b, 5a-b, and FIGS. 7a-b.

One test or a combination of tests can be run to determine open circuits with a test for short circuits, and the combination of tests can be run in any order. In other words, method 11 can be conducted followed by method 13 to test for open and short circuits. Similarly, method 12 can be conducted followed by method 13 to test for open and short circuits.

Tester 3 contains testing protocol data files that operate sections of the Tester 3 (e.g., an FPGA) to direct tests for determining DUT continuity in accordance with embodiments of the invention. Testing protocol data files can include instructions for completing multiple tests including: measuring RC delay on DUT IO (with and without a DUT installed and coupled with the DUT IO) to determine open circuits 11 to generate two sets of RC delay test results; measuring TDR for DUT and testing system (with and without a DUT installed and coupled with DUT IO) to generate two sets of TDR test result sets and comparing the differences in test set results to determine open circuits 12; and measuring voltage on remaining pins while forcing voltage onto a single pin in order to determine short circuits 13 (with and without a DUT installed and coupled with DUT IO) to generate two sets of test result sets then comparing them.

Prior to applying tests for identifying either open circuits or short circuits, a sample rate must be selected and DUT 4 must be calibrated to create a profile. In one embodiment, to select a sample rate, select fastest possible sample rate that a source can provide. A datasheet can be used to determine maximum frequency for signals. Determine if any negative effects (i.e. too much power consumption, too much heat generation, lifetime degradation of sample rate source) exists using sample rate. Determine whether sample rate is sufficient to sample signals in tests to be performed.

Figure 3A:
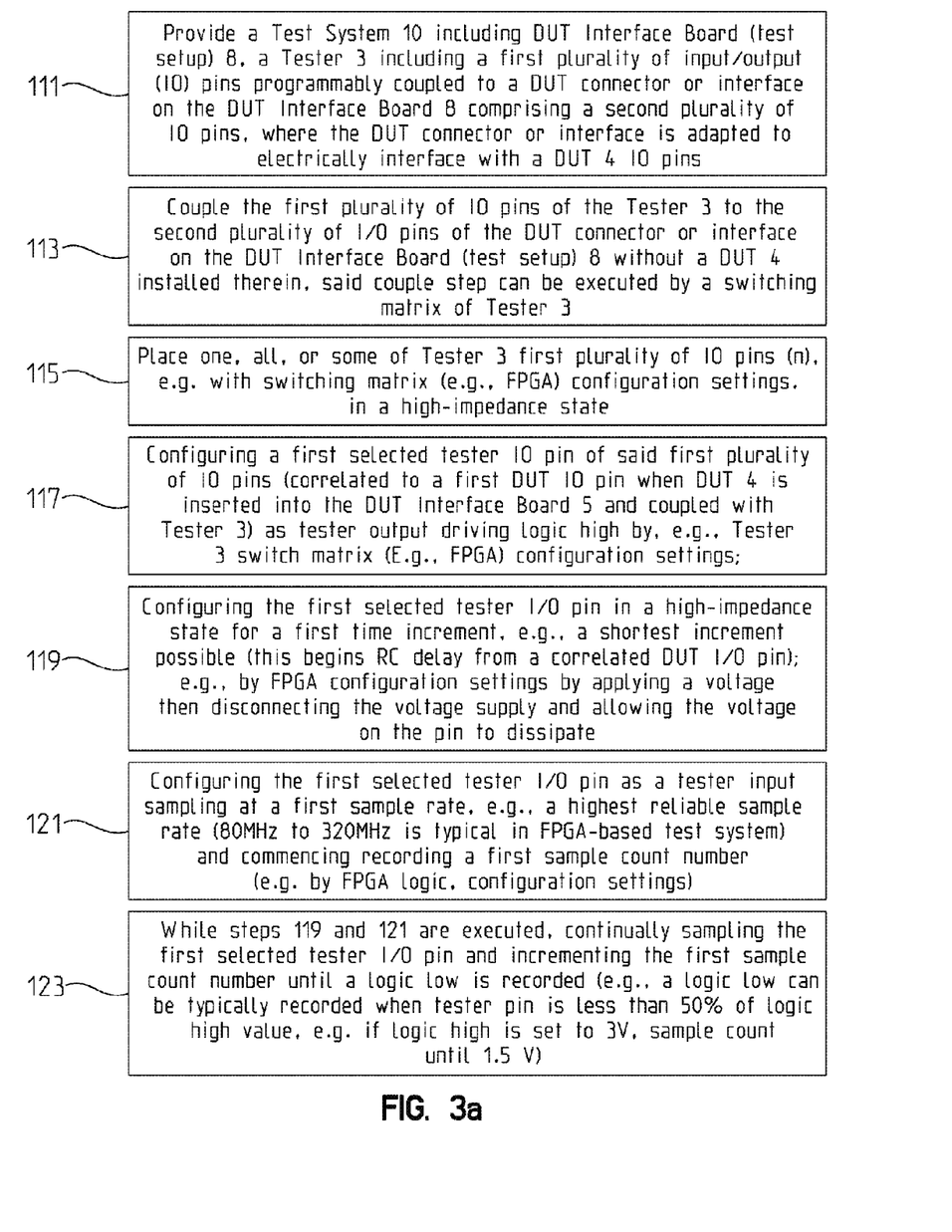
FIGS. 3a and 3b show a process of an exemplary method for identifying open circuits by measuring RC delay on DUT IO.
Figure 3B:
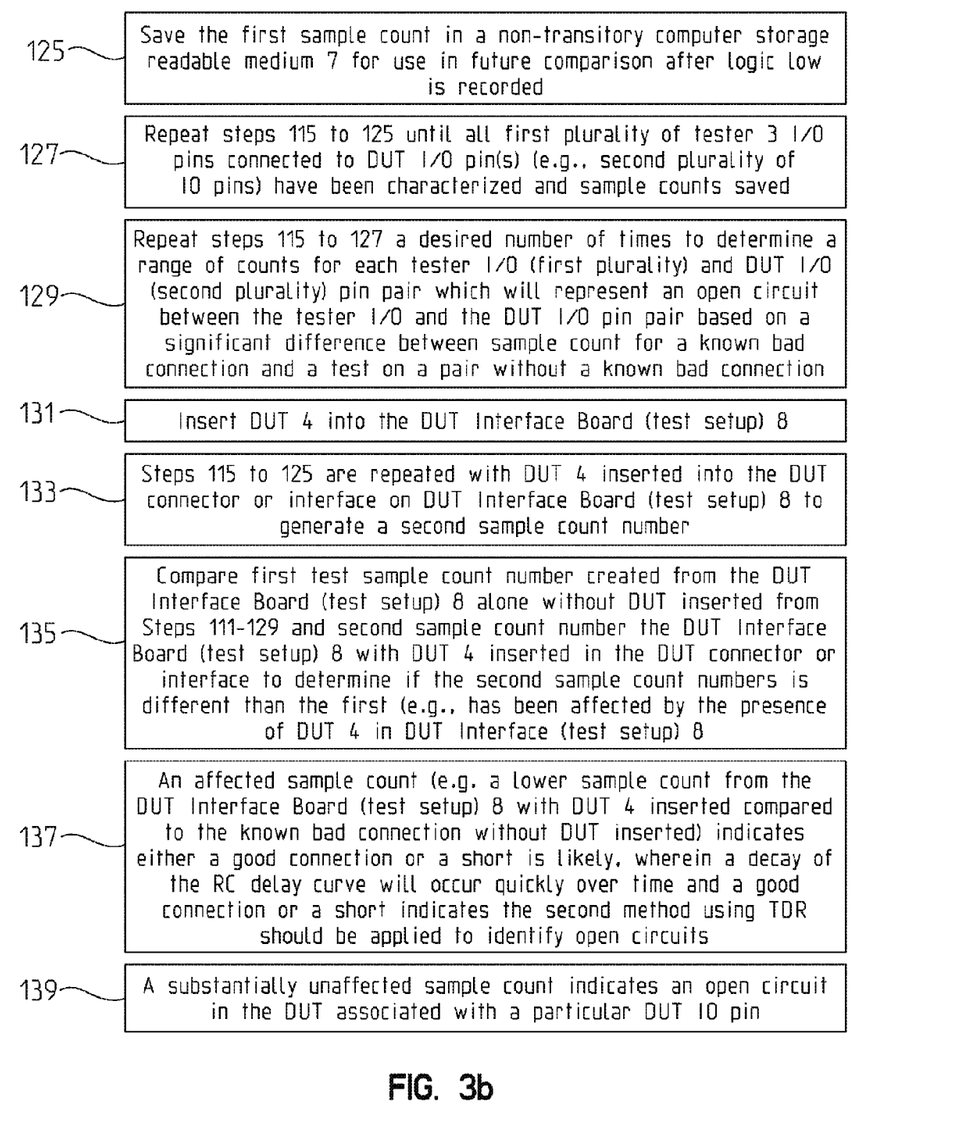

Referring to FIGS. 3a and 3b, a method of identifying open circuits by measuring RC delay on DUT IO elements in accordance with an embodiment of the invention. In general, an embodiment of an RC delay on DUT IO elements can a include a first step of incrementally charging or applying a charge above a threshold (e.g., logic or voltage high) on a DUT socket IO pins without a DUT installed in the DUT socket then sampling RC signals at the sample rate determined above until a subsequent sample falls below the threshold then recording a number of samples taken to generate a first RC delay sample dataset; repeating the first step with a DUT installed in the DUT socket and recording a number of samples taken to generate a second RC delay sample dataset; comparing the first and second RC delay sample dataset and determining an open circuit based on a match or no match of numbers of samples between the first and second RC delay datasets (or a plus/minus match e.g., a match will be determined if the first and second sample numbers are plus or minus e. g., ten percent between numbers of samples in the first and second RC delay datasets). In particular, an exemplary method can include providing a Test System 10 including DUT Interface Board (test setup) 8, a Tester 3 including a first plurality of IO pins programmably (e.g., by switch matrix or FPGA) coupled to a DUT connector or interface on the DUT Interface Board (test setup) 8 comprising a second plurality of IO pins at step 111 wherein said second plurality of IO pins selectively electrically interface with a third plurality of DUT 4 IO elements. At step 113, coupling the first plurality of IO pins of the Tester 3 to the second plurality of I/O pins of the DUT connector or interface on the DUT Interface Board (test setup) 8 without a DUT 4 installed therein. At step 115, one, all, or some of Tester pins (n) or IOs on Tester 3 selectively coupled to DUT IOs or pins (first plurality of IO pins) are placed in a high impedance state. In this example, at step 113, one, all or some Tester pins (n) or IOs on Tester 3 that are selectively coupled to DUT's IO pins or elements using a switch matrix, e.g., with Field Programmable Gate Array (FPGA) configuration settings, are placed in a high impedance state. At step 117, a first Tester 3 IO pin (programmably connected to a first DUT connector or interface IO pin) of said first plurality of IO pins is configured as tester output driving logic high by, e.g. FPGA configuration settings. At step 119, the first Tester 3 IO pin is configured in a high impedance state for a shortest increment possible (this begins RC delay from DUT IO pin), e.g., by FPGA configuration settings, by applying a voltage then disconnecting the voltage supply and allowing the voltage on the pin to dissipate. At step 121, the first tester IO pin is configured as a tester input sampling at a highest reliable sample rate (e.g., 80 MHz to 320 MHz can be typical in FPGA based test system) and a first sample count recorded; e.g., by FPGA configuration settings. At step 123, during execution of steps 119 and 123, the first tester IO pin is continually sampled and incrementing the first sample count number until a logic low is recorded (e.g., logic low is typically recorded when selected tester pin (e.g., first Tester 3 IO pin) is less than 50% of logic high value, e.g. if logic high is set to 3V, sample count until 1.5V). More generally, in one example, step 123 can include, e.g., charging a selected pin, removing charge, and sampling while counting the samples per unit time and allowing pin charge dissipate over time until a predetermined logic (1 or 0 or voltage above threshold) value is detected and converting the first sample count number back to a measure of time. At step 125, the first sample count number is saved in a non-transitory computer storage readable medium 7 for use in future comparison after logic low is detected or recorded. At step 127, steps 115 to 125 are repeated until all tester IO pins connected to DUT IO pins have been characterized and a plurality of sets of first sample counts saved associated with each DUT IO pins. At step 129, steps 115 to 127 are repeated a desired number of times to determine a range of counts for each tester IO and DUT IO pin pair which will represent an open circuit between the tester IO and the DUT IO pin pair based on a significant difference between sample count for a known bad connection (e.g., without DUT 4 inserted) and a test on a pair without a known bad connection.

Figure 4:
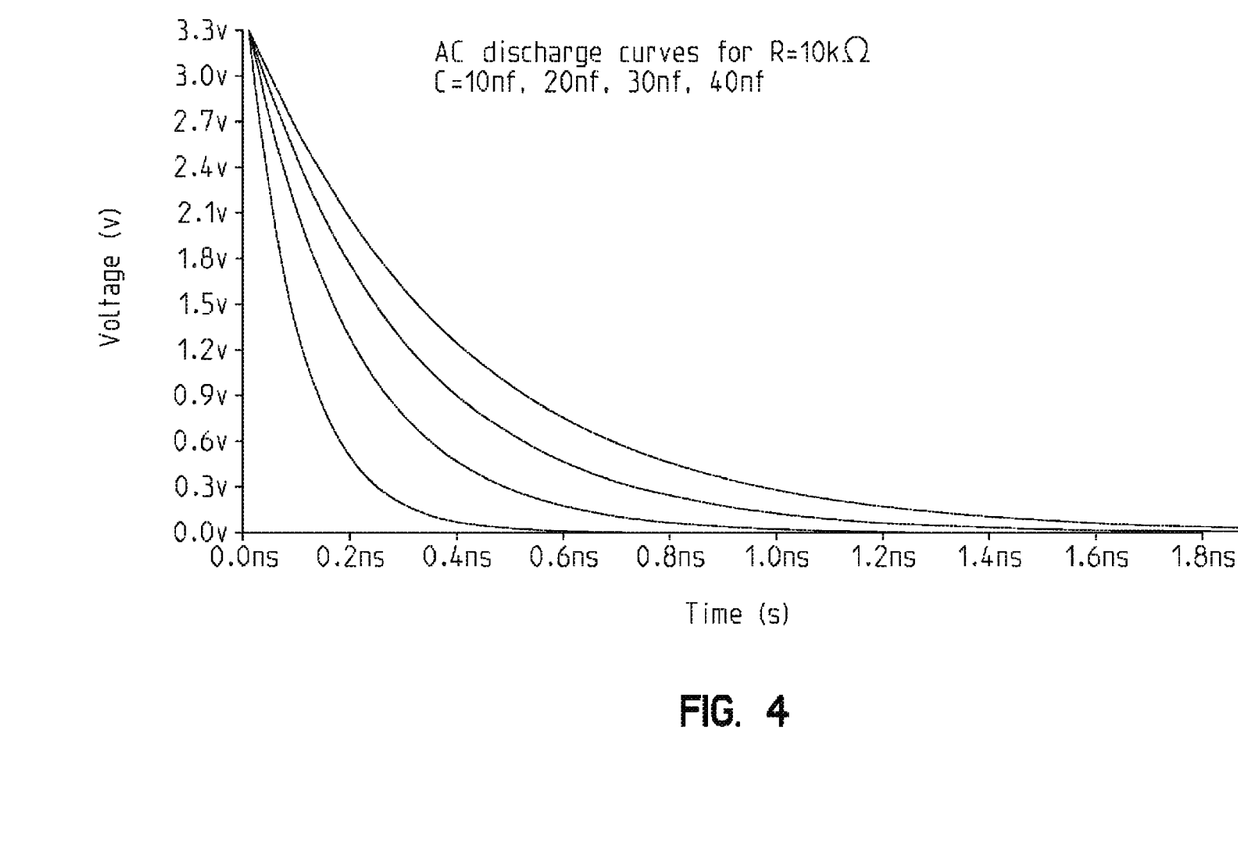
FIG. 4 shows an example of variance in RC delay curves for 10 nF, 20 nF, 30 nF, 40 nF capacitances to demonstrate effect of added DUT capacitance on tester IO structures in accordance with one embodiment of the invention.

Referring to FIG. 3b, at step 131, a DUT 4 is inserted into DUT Interface Board (test setup) 8. At step 133, steps 115 to 125 are repeated with DUT 4 inserted into the DUT Interface Board (test setup 8) to generate a second sample count number which should be compared with the first sample count number for each DUT IO to determine if the sample count has been affected by the present of DUT 4 in DUT Interface Board (test setup) 8. At step 137, an affected sample count (e.g. a lower sample count from the test setup assembly with DUT 4 inserted compared to the known bad connection) indicates either a good connection or a short is likely, wherein a decay of the RC delay curve will occur quickly over time, a good connection or a short indicates the second method using TDR should be applied to identify open circuits. At step 139, an unaffected sample count indicates an open circuit in the DUT continuity wherein a decay of the RC delay curve will occur more slowly over time as the second sample count is greater than the first count. FIG. 4 shows sample RC delay curves in accordance with a method such as described above.

Figure 5A:
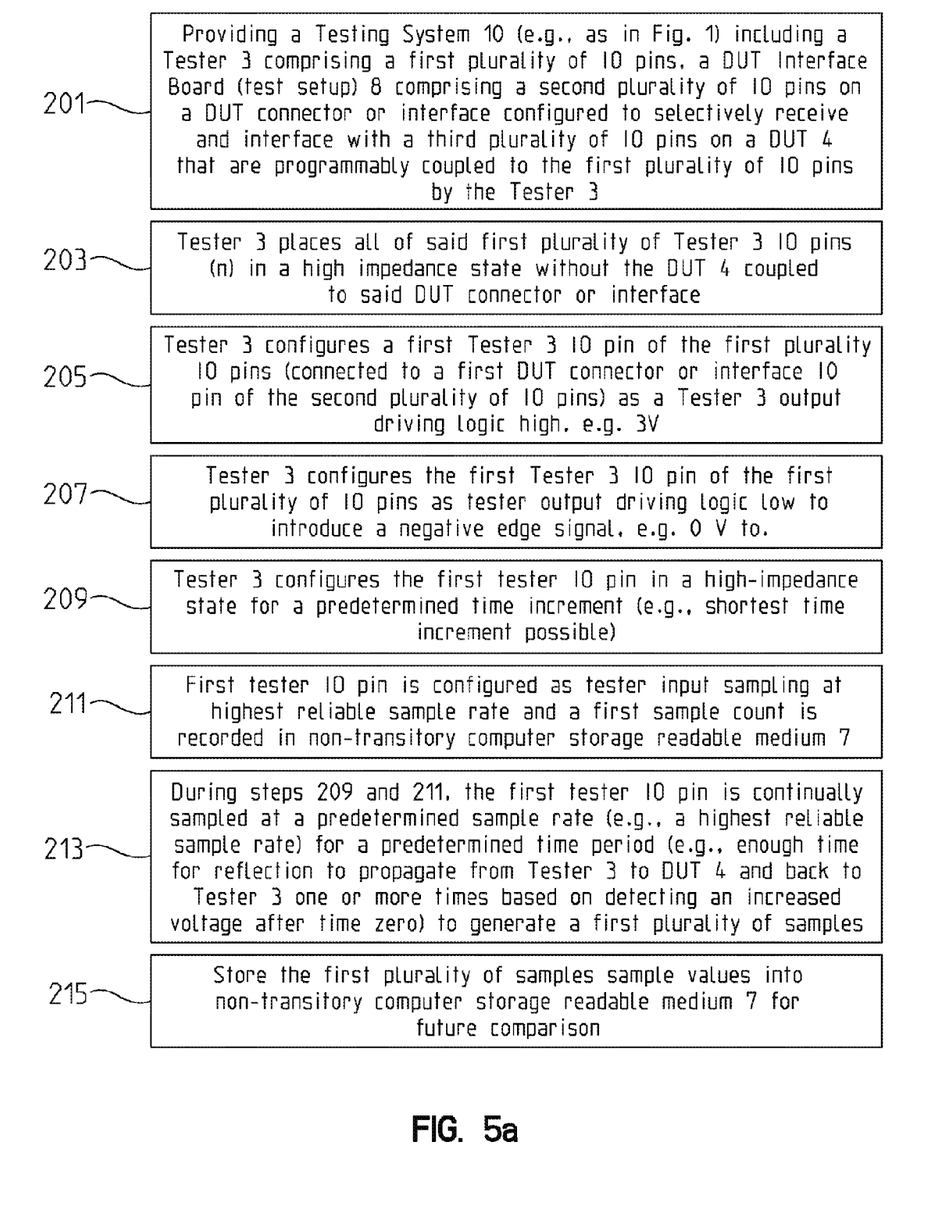
FIGS. 5a and 5b show a process of an exemplary method for identifying open circuits using time domain reflectometry.
Figure 5B:
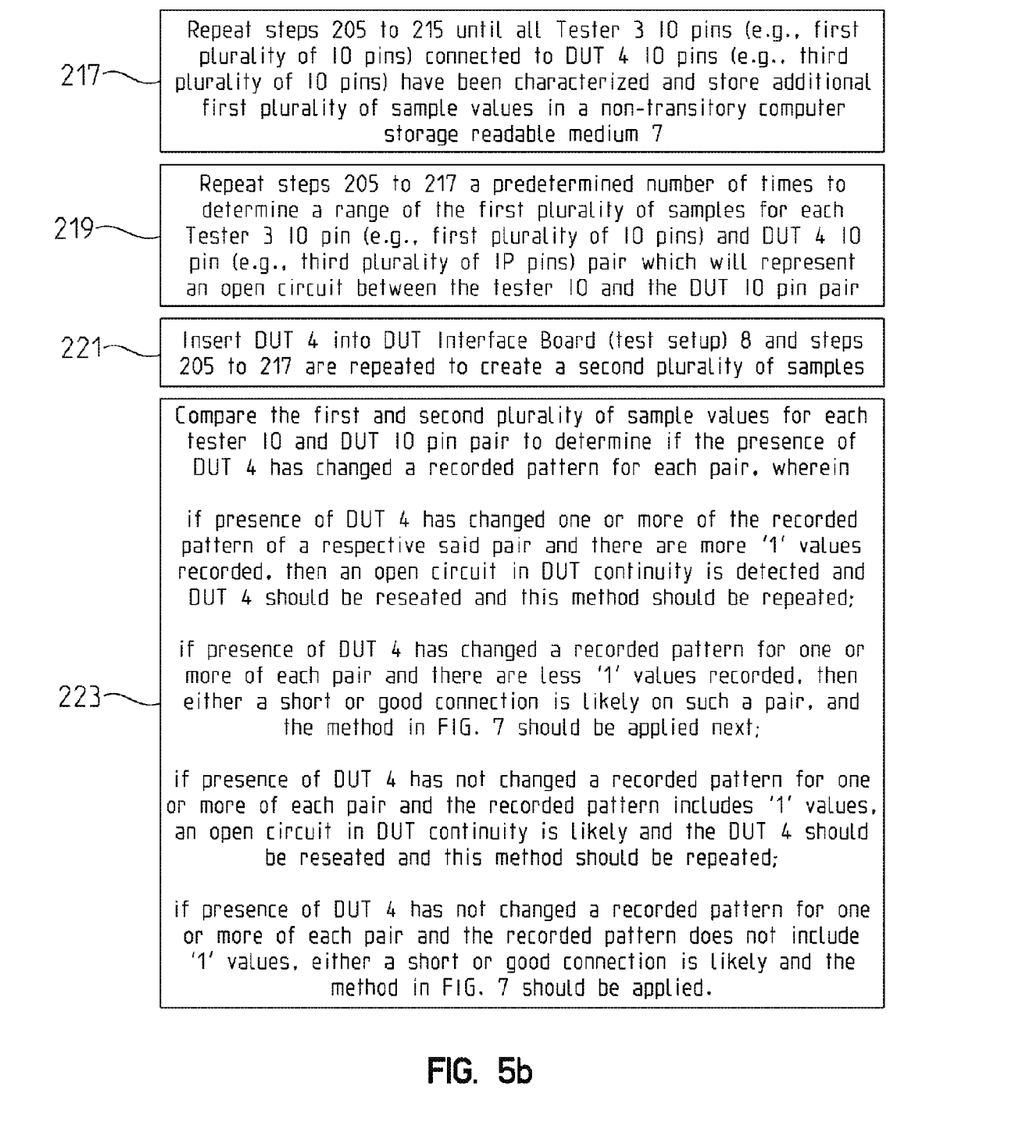

Referring to FIGS. 5a and 5b, a method of identifying open circuits using TDR in accordance with an embodiment of the invention is shown. At step 301, exemplary method comprises providing a Testing System 10 (e.g., as in FIG. 1) including a Tester 3 comprising a first plurality of IO pins, a DUT Interface Board (test setup) 8 comprising a second plurality of IO pins on a DUT connector or interface configured to selectively receive and interface with a third plurality of IO pins on a DUT 4 that are programmably coupled to the first plurality of IO pins by the Tester 3 at step 201. At step 203, placing all of said first plurality of Tester 3 IO pins (n) in a high impedance state without the DUT 4 coupled to said DUT connector or interface. At step 205, Tester 3 configures a first Tester 3 IO pin of the first plurality IO pins (connected to a first DUT connector or interface IO pin of the second plurality of IO pins) as a Tester 3 output driving logic high, e.g. 3V. At step 207, Tester 3 configures the first Tester 3 IO pin of the first plurality of IO pins as tester output driving logic low to introduce a negative edge signal, e.g. 0 V. At step 209, Tester 3 configures the first tester IO pin in a high-impedance state for a predetermined time increment (e.g., shortest time increment possible); e.g. 3V. At step 211, the first tester IO pin is configured as tester input sampling at highest reliable sample rate and a first sample count is recorded in non-transitory computer storage readable medium 7. At step 213, during steps 209 and 211, the first tester IO pin is continually sampled at a predetermined sample rate (e.g., a highest reliable sample rate) for a predetermined time period (e.g., enough time for reflection to propagate from Tester 3 to DUT 4 and back to Tester 3 one or more times based on detecting an increased voltage after time zero) to generate a first plurality of samples. At step 215, storing the first plurality of samples sample values into non-transitory computer storage readable medium 7 for future comparison. At step 217, repeat steps 205 to 215 until all Tester 3 IO pins (e.g., first plurality of IO pins) connected to DUT 4 IO pins (e.g., third plurality of IO pins) have been characterized and store additional first plurality of sample values in a non-transitory computer storage readable medium 7. At step 219, repeat steps 205 to 217 a predetermined number of times to determine a range of the first plurality of samples for each Tester 3 IO pin (e.g., first plurality of IO pins) and DUT 4 IO pin (e.g., third plurality of IP pins) pair which will represent an open circuit between the tester IO and the DUT IO pin pair. At step 221, insert DUT 4 into DUT Interface Board (test setup) 8 and steps 205 to 217 are repeated to create a second plurality of samples. At step 223, compare the first and second plurality of sample values for each tester IO and DUT IO pin pair to determine if the presence of DUT 4 has changed a recorded pattern for each pair. If presence of DUT 4 has changed one or more of the recorded pattern of a respective said pair and there are more '1' values recorded, then an open circuit in DUT continuity is detected and DUT 4 should be reseated and this method should be repeated. If presence of DUT 4 has changed a recorded pattern for one or more of each pair and there are less '1' values recorded, then either a short or good connection is likely on such a pair, and the method in FIGS. 7a-b should be applied next. If presence of DUT 4 has not changed a recorded pattern for one or more of each pair and the recorded pattern includes '1' values, an open circuit in DUT continuity is likely and the DUT 4 should be reseated and this method should be repeated. If presence of DUT 4 has not changed a recorded pattern for one or more of each pair and the recorded pattern does not include ' 1' values, either a short or good connection is likely and the method in FIGS. 7a-b should be applied.

Figure 6:
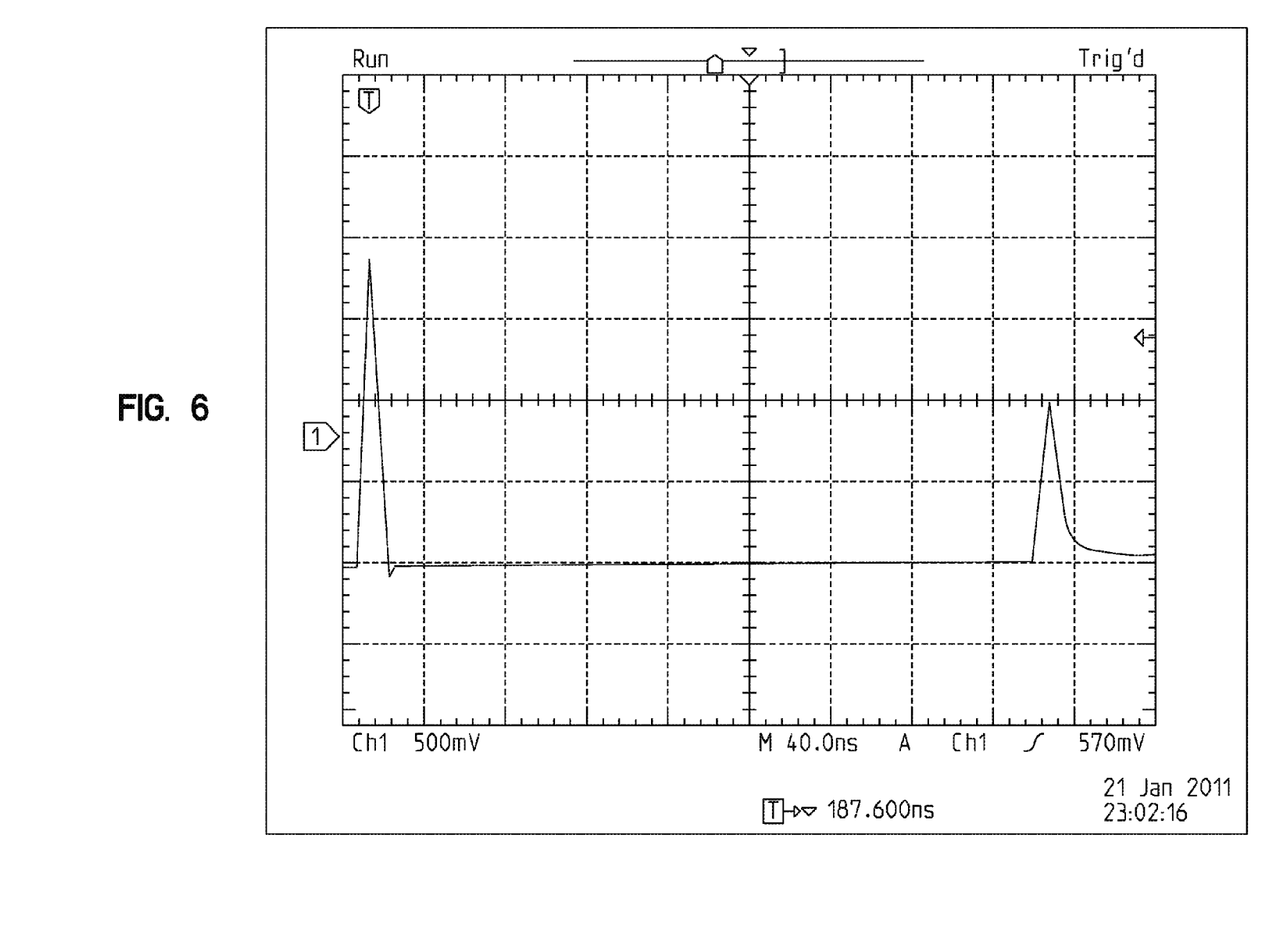
FIG. 6 shows an example of reflection caused by an open circuit in accordance with an embodiment of the invention.

FIG. 6 shows an exemplary output graph for TDR testing in accordance with the FIG. 5 method.

Figure 7A:
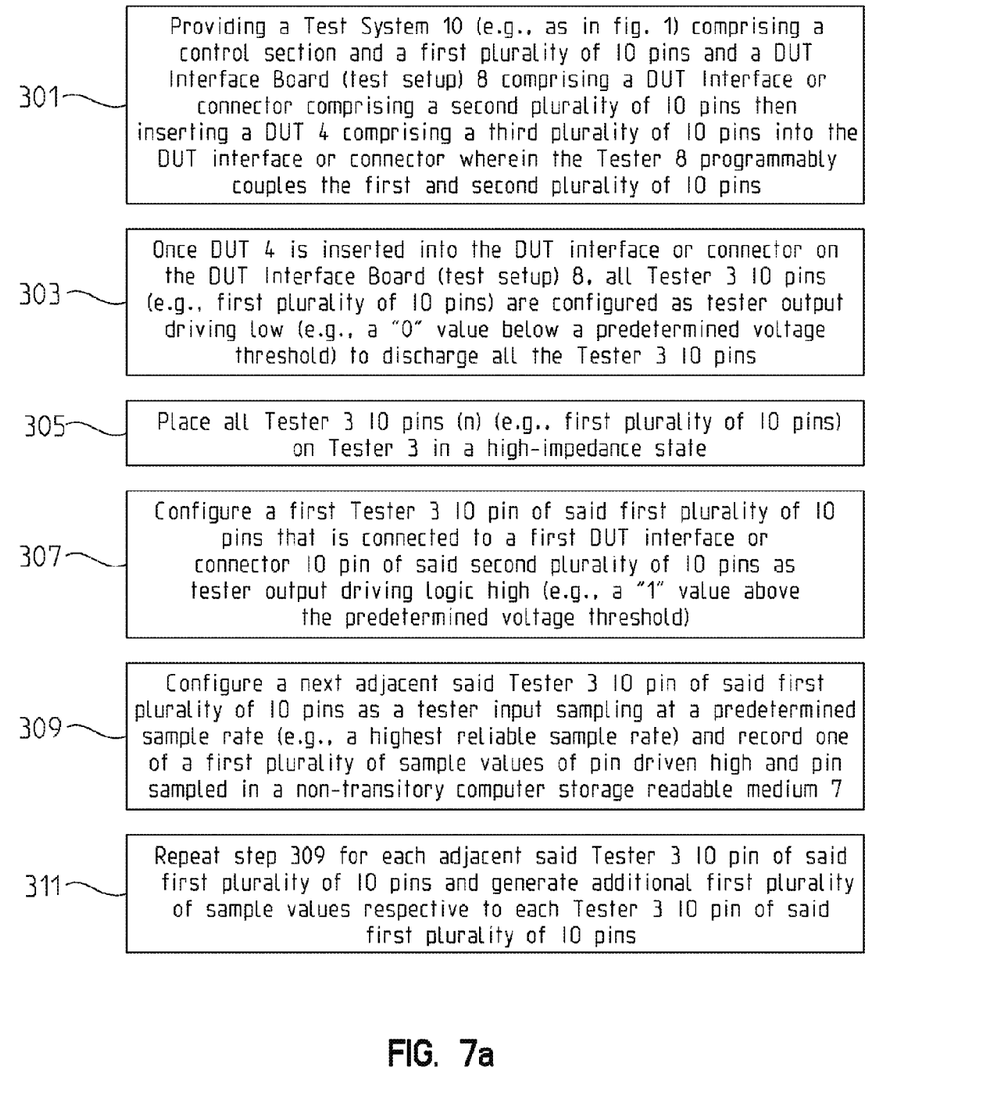
FIGS. 7a and 7b show a process of an exemplary method for identifying short circuits by forcing voltage on a single pin while measuring voltage in remaining pins.
Figure 7B:
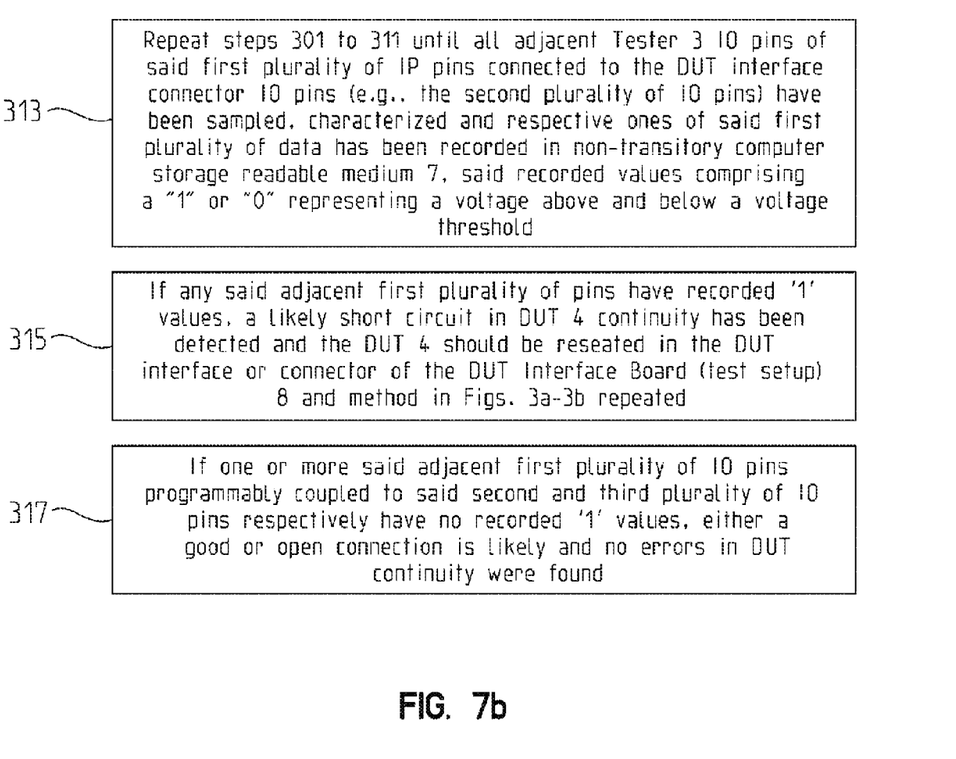

Referring to FIGS. 7a-b, a method 13 of identifying short circuits by forcing voltage on a single pin while measuring voltage on remaining pins in accordance with an embodiment of the invention. At step 301, providing a Test System 10 (e.g., as in FIG. 1) comprising a control section and a first plurality of IO pins and a DUT Interface Board (test setup) 8 comprising a DUT Interface or connector comprising a second plurality of IO pins then inserting a DUT 4 comprising a third plurality of IO pins into the DUT interface or connector wherein the Tester 8 programmably couples the first and second plurality of IO pins. At step 303, once DUT 4 is inserted into the DUT interface or connector on the DUT Interface Board (test setup) 8, all Tester 3 IO pins (e.g., first plurality of IO pins) are configured as tester output driving low to discharge all the Tester 3 IO pins. At step 305, place all Tester 3 IO pins (n) (e.g., first plurality of IO pins) on Tester 3 in a high-impedance state. At step 307, Configure a first Tester 3 IO pin of said first plurality of IO pins that is connected to a first DUT interface or connector IO pin of said second plurality of IO pins as tester output driving logic high. At step 309, configure a next adjacent said Tester 3 IO pin of said first plurality of IO pins as a tester input sampling at a predetermined sample rate (e.g., a highest reliable sample rate) and record one of a first plurality of sample values of pin driven high and pin sampled in a non-transitory computer storage readable medium 7. At step 311, repeat step 309 for each adjacent said Tester 3 IO pin of said first plurality of IO pins and generate additional first plurality of sample values respective to each adjacent Tester 3 IO pin of said first plurality of IO pins. At step 313, repeat steps 301 to 311 until all adjacent Tester 3 IO pins of said first plurality of IP pins connected to the DUT interface connector IO pins (e.g., the second plurality of IO pins) have been sampled, characterized and respective ones of said first plurality of data has been recorded in non-transitory computer storage readable medium 7, said recorded values comprising a "1" or "0" representing a voltage above and below a voltage threshold. At step 315, if any said adjacent first plurality of pins have recorded '1' values, a likely short circuit in DUT 4 continuity has been detected and the DUT 4 should be reseated in the DUT interface or connector of the DUT Interface Board (test setup) 8 and method in FIGS. 3a and 3b repeated. At step 317, if one or more said adjacent first plurality of IO pins programmably coupled to said second and third plurality of IO pins respectively have no recorded '1' values, either a good or open connection is likely and no errors in DUT 4 continuity were found.

Figure 8:
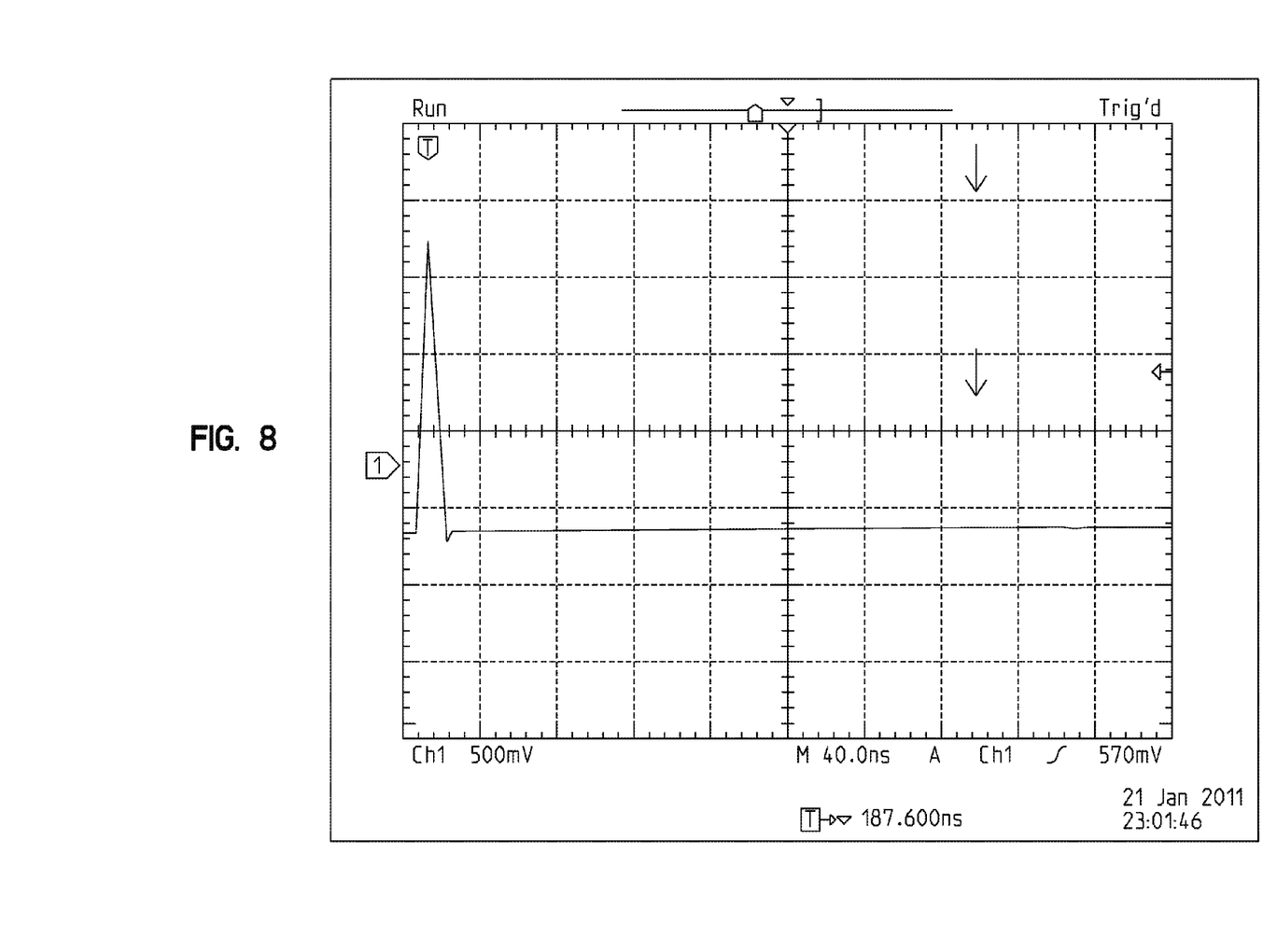
FIG. 8 shows an example of no reflection caused by presence of DUT in accordance with an embodiment of the invention.
Figure 9:
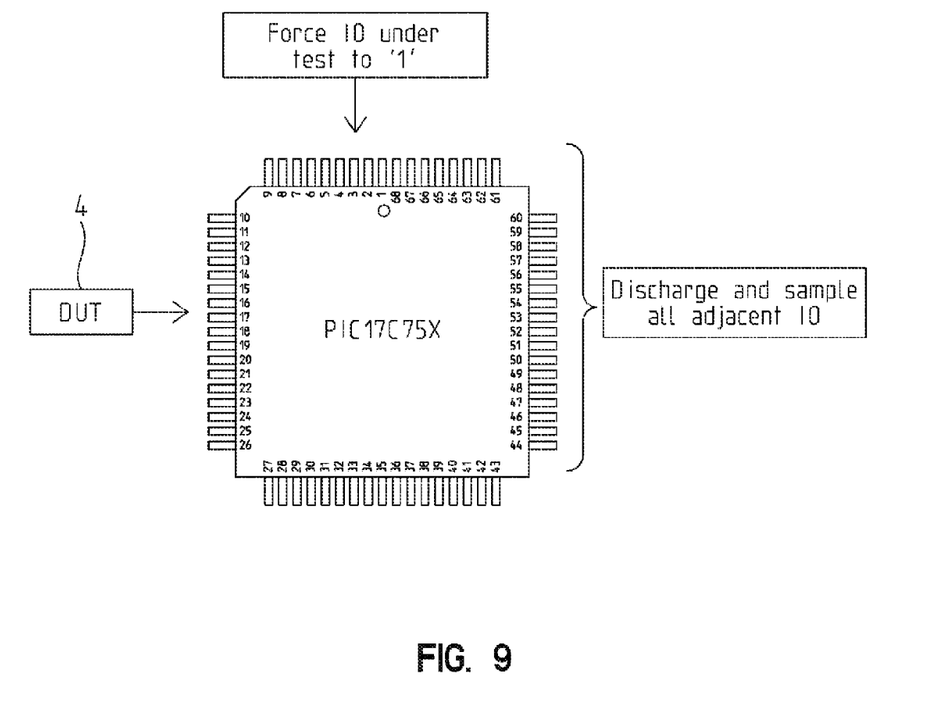
FIG. 9 shows an example of holding a single DUT IO at '1' while sampling adjacent DUT IO in accordance with one embodiment of the invention.

FIG. 8 shows an example of no reflection in the exemplary FIGS. 7a-b method caused by a presence of DUT 4 in accordance with an embodiment of the invention. FIG. 9 shows an example of holding a single DUT TO at '1' while sampling adjacent DUT TO in accordance with method 13 and one embodiment of the invention.

Figure 10:
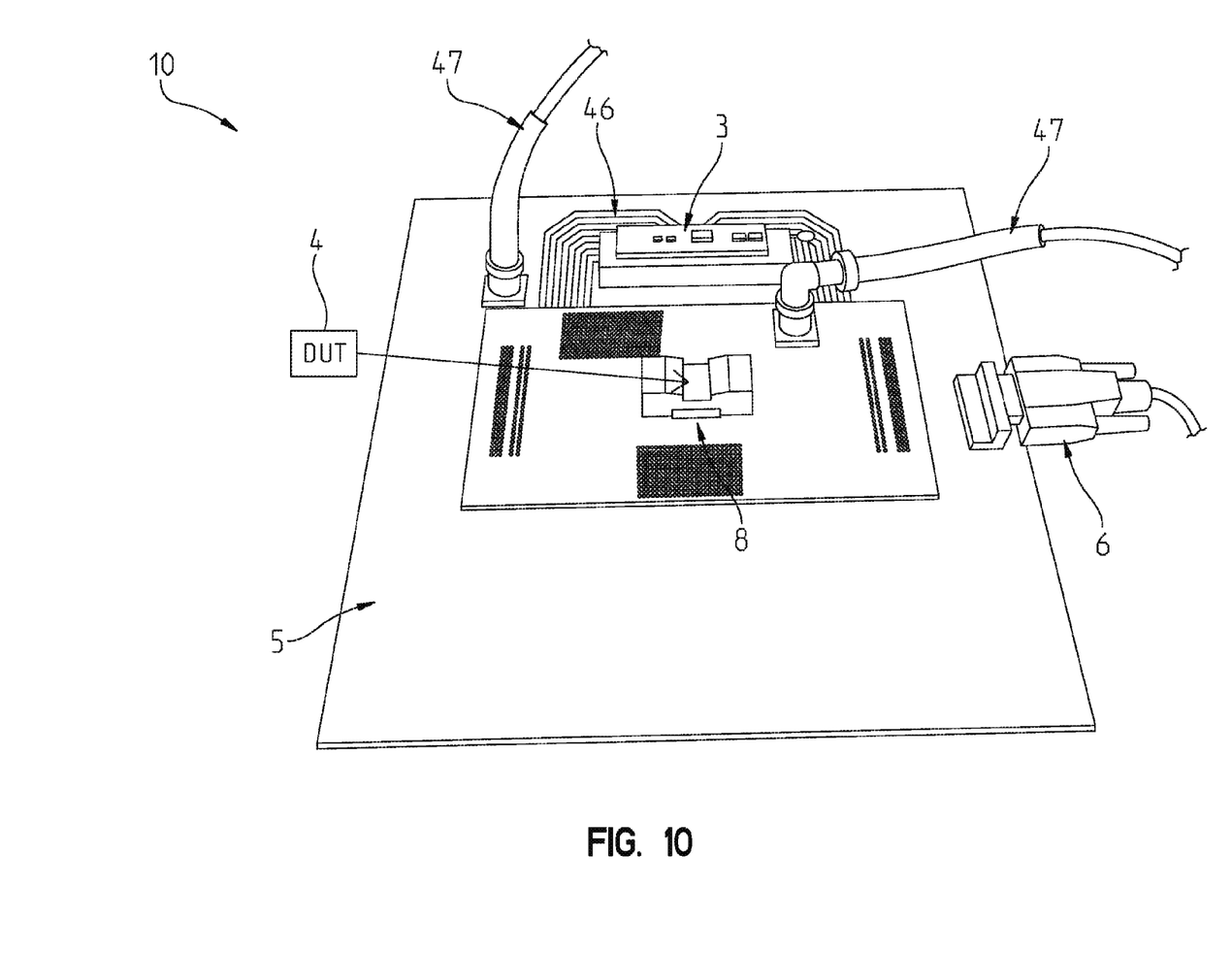
FIG. 10 shows a close up image of a DUT Board in an exemplary testing system setup.

Referring to FIG. 10, a close up of a Test System 10 configured to test and report on, e.g., continuity of a DUT 4 is shown. An exemplary embodiment includes a DUT Adapter Board 5 coupled with a Tester 3, a DUT 4 placed into a socket in a DUT Interface Board (test setup) 8 connected to the DUT Adapter Board 5. Tester 3 is connected to DUT 4 by electrical connections 46. Cables 47 supply power to Test System 10 from power supply (not shown) and are connected to DUT Adapter Board 5. An RS-232 PC connection 6 is also coupled to DUT Adapter Board 5 and transmits output information from DUT Adapter Board 5 to a testing interface computer 2 (not shown).

Figure 11:
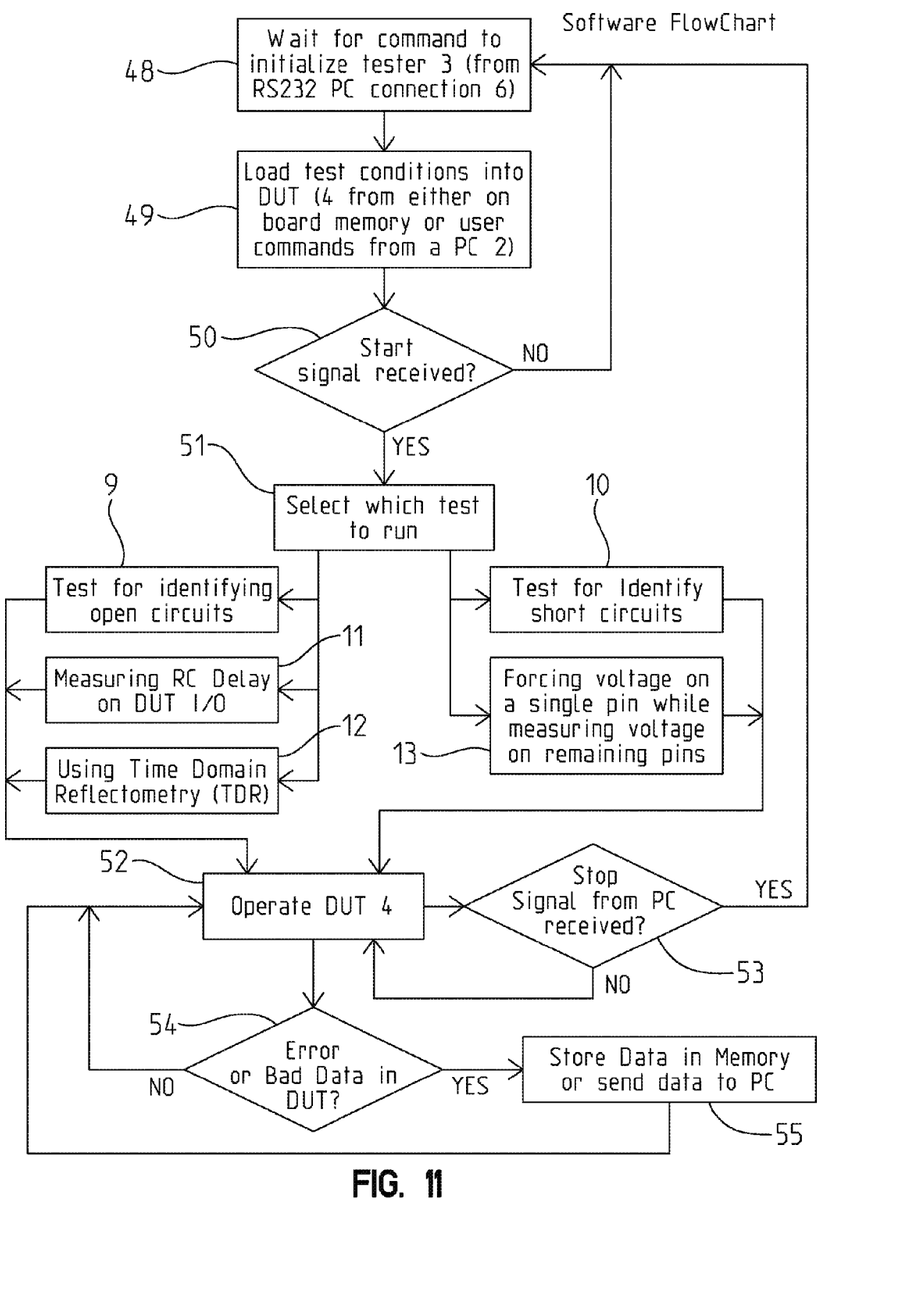
FIG. 11 shows a flowchart of an exemplary process for running software for the DUT continuity test.

Referring to FIG. 11, a flowchart shows an exemplary process for running software for DUT continuity test. At step 48, tester 3 is initialized from RS2332 PC connection 6. At step 49, test conditions are loaded into DUT 4 from either on board memory or user commands from a PC 2. If a start signal 50 is not received then go back to step 48 and wait for command to initialize tester 3 again. If a start signal 50 is received, then at step 51, a test is selected from a list of tests for identifying open circuits 9 or a list for identifying short circuits 10. Once a test is selected, at step 52, DUT 4 is operated. If a stop signal from PC 2 is received, then proceed to step 48 and wait for command to initialize tester 3. If a stop signal from PC 53 is not received then continue to operate DUT 4 at step 52. If an error or bad data 54 appears in DUT 4 then store data in memory or send data to PC 2 according to step 55, and then return to operate DUT 4 at step 52. If an error or bad data 54 does not appear in DUT 4 then return to operate DUT 4 at step 52.

Although the invention has been described in detail with reference to certain preferred embodiments, variations and modifications exist within the spirit and scope of the invention as described and defined in the following claims.

The invention claimed is:

1. A method for identifying open circuits using time domain reflectometry (TDR) comprising:
providing a test setup comprising a tester coupled to a DUT board;
placing all tester pins on said tester in a high impedance state;
configuring a first tester I/O pin connected to a first DUT I/O pin as a tester output driving logic high;
configuring said first tester I/O pin as a tester output logic low to introduce a negative edge signal;
configuring said first tester I/O pin in a high impedance state;
configuring said first tester I/O pin as tester input sampling a highest reliable sample rate generating a sample count;
recording said sample count in a non-transitory computer storage readable medium;
continually sampling said first tester I/O pin during prior two configuring and recording steps at highest reliable sample rate for enough time for reflection to propagate from said tester to said DUT and back to said tester;
wherein said sampling step is based on detecting an increased voltage after time zero and generates sample values;
storing said sample values into said non-transitory computer storage readable medium;
repeating said configuring, sampling, and storing steps until all tester I/O pins connected to DUT I/O pins have been characterized and said sample values stored in said non-transitory computer storage readable medium;
repeating said configuring, sampling, storing and prior repeating steps a desired number of times to determine a range of sample for each tester I/O and DUT I/O pin pair which represents an open circuit between said tester I/O and DUT I/O pin pair;
inserting a DUT into said test setup;
repeating said configuring, sampling and storing steps generating a recorded value for each tester I/O and DUT I/O pin pair;
comparing said recorded value with said sample values to determine if the insertion of said DUT has changed a recorded pattern for each tester I/O and DUT I/O pin pair.

2. The method of claim 1:
wherein said comparing step indicating that the presence of said DUT has changed said recorded pattern for each tester I/O and DUT I/O pin pair and said recorded pattern includes more '1' values recorded, then an open circuit in the continuity data of said DUT is detected.

3. The method of claim 1:
wherein said comparing step indicating that the presence of said DUT has changed said recorded pattern for each tester I/O and DUT I/O pin pair and said recorded pattern includes less '1' values recorded, then either a short or good connection is detected in the continuity data of said DUT.

4. The method of claim 1:
wherein said comparing step indicating that the presence of said DUT has not changed said recorded pattern for each tester I/O and DUT I/O pin pair and said recorded pattern includes '1' values, then an open circuit in DUT continuity is likely.

5. The method of claim 1:
wherein said comparing step indicating that the presence of said DUT has not changed said recorded pattern for each tester I/O and DUT I/O pin pair and said recorded pattern does not include '1' values, then either a short or good connection is likely.

* * * * *